United States Patent
Lin et al.

(10) Patent No.: US 6,187,505 B1
(45) Date of Patent: Feb. 13, 2001

(54) RADIATION SENSITIVE SILICON-CONTAINING RESISTS

(75) Inventors: Qinghuang Lin, Wappingers Falls; Ahmad D. Katnani, Poughkeepsie, both of NY (US); Douglas Charles LaTulipe, Jr., Danbury, CT (US); David E. Seeger, Congers, NY (US); William Ross Brunsvold, Poughkeepsie, NY (US); Ali Afzali-Ardakani, Yorktown Heights, NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/241,441

(22) Filed: Feb. 2, 1999

(51) Int. Cl.$^7$ .................................................. G03F 7/004

(52) U.S. Cl. .......................................................... 430/270.1

(58) Field of Search .......................................... 430/270.1

(56) References Cited

U.S. PATENT DOCUMENTS

| | | | |
|---|---|---|---|
| 5,296,332 | * 3/1994 | Sachdev et al. | 430/270 |
| 5,607,989 | * 3/1997 | Bantu et al. | 430/270.1 |
| 5,882,844 | * 6/1999 | Tsuchiya et al. | 430/288.1 |
| 5,968,712 | * 10/1999 | Thackeray et al. | 430/326 |

OTHER PUBLICATIONS

"Chemically Amplified Resists", Lamola, A.A., Solid State Tech., Aug. 1991, pp. 53–60.*

"High Speed Silicon Bilayer Negative Resist", anonymous, Research Disclosure, Kenneth Mason Publication, NY, vol. 328, 1991, pp. 606.*

* cited by examiner

*Primary Examiner*—Janet Baxter
*Assistant Examiner*—Rosemary Ashton
(74) *Attorney, Agent, or Firm*—Pollock, Vande Sande & Amernick; Daniel P. Morris

(57) ABSTRACT

A high-performance radiation sensitive silicon-containing negative-tone resist is provided along with a method of using the silicon-containing resist in multilayer, including bilayer, imaging for manufacturing semiconductor devices. The negative-tone silicon-containing resist is based on an acid catalyzed high-contrast crosslinking of aqueous base soluble silicon-containing phenolic polymers through reaction of a carbocation of the crosslinking agent with the hydroxyl site of the phenolic group in the silicon-containing polymers. A chemically amplified silicon-containing negative-tone resist composition comprising said silicon-containing polymer resin; at least one crosslinking agent; one acid generator; and a solvent is provided. The silicon-containing resist composition has high silicon content and provide excellent resolution and a means of patterning high aspect ratio resist patterns. The resist compositions can be used as the top imaging layer in a multilayer, including bilayer, scheme to fabricate semiconductor devices using various irradiation sources, such as mid-ultraviolet (UV), deep-UV, extreme UV, X-ray, e-beam and ion-beam irradiation.

17 Claims, No Drawings

RADIATION SENSITIVE SILICON-CONTAINING RESISTS

DESCRIPTION

FIELD OF THE INVENTION

The present invention relates to high-performance radiation sensitive resist compositions and their use in multilayer lithography processes to fabricate semiconductor devices. Specifically, the present invention is concerned with negative-tone silicon-containing resist compositions based on an acid catalyzed crosslinking of aqueous base soluble silicon-containing polymers. The resist composition of the present invention can be used as the top imaging layer in a multilayer, including bilayer, technique to fabricate semiconductor devices using various irradiation sources, such as mid-ultraviolet (UV), deep-UV (for example 248 nm, 193 nm and 157 nm), extreme UV, X-ray, e-beam and ion-beam irradiation.

BACKGROUND OF THE INVENTION

In the manufacture of patterned devices such as semiconductor chips and chip carriers the steps of etching different layers which constitute the finished product are among the most critical and crucial steps involved.

In semiconductor manufacturing, optical lithography has been the main stream approach to pattern semiconductor devices. In typical prior art lithography processes, UV light is projected onto a silicon wafer coated with a layer of photosensitive resist through a mask that defines a particular circuitry pattern. Exposure to UV light, followed by subsequent baking, induces a photochemical reaction which changes the solubility of the exposed regions of the photosensitive resist. Thereafter, an appropriate developer, typically an aqueous base solution, is used to selectively remove the resist either in the exposed regions (positive-tone resists) or, in the unexposed region (negative-tone resists). The pattern thus defined is then imprinted on the silicon wafer by etching away the regions that are not protected by the resist with a dry or wet etch process.

The current state-of-the-art optical lithography uses DUV irradiation at a wavelength of 248 nm to print features as small as 250 nm in volume semiconductor manufacturing. The continued drive for the miniaturization of semiconductor devices places increasingly stringent requirements for resist materials, including high resolution, wide process latitude, good profile control and excellent plasma etch resistance for image transfer to substrate. Several techniques for enhancing the resolution, such as reduced irradiation wavelength (from 248 nm to 193 nm), higher numerical aperture (NA) of the exposure systems, use of alternate masks or illumination conditions, and reduced resist film thickness are currently being pursued. However, each of these approaches to enhance resolution suffers from various tradeoffs in process latitude, subsequent substrate etching and cost. For example, increasing NA of the exposure tools also leads to a dramatic reduction in the depth of focus. The reduction in the resist film thickness results in the concomitant detrimental effect of decreased etch resistance of the resist film for substrate etching. This detrimental effect is exasperated by the phenomenon of etch induced microchannel formation during substrate etch, effectively rendering the top 0.2–0.3 $\mu$m resist film useless as an etch mask for substrate etching.

It would therefore be desirable to provide for enhanced resolution without experiencing drawbacks of the prior art.

Furthermore, bilayer imaging schemes have been suggested. In a bilayer imaging scheme, typically, images are first defined in a thin, usually 0.1–0.3 $\mu$m thick, silicon containing resist with a wet process on a relatively thick high absorbing organic underlayer. The images thus defined are then transferred into the underlayer through a selective and highly anisotropic oxygen reactive ion etching ($O_2$ RIE) where silicon in the top imaging layer is converted into nonvolatile silicon oxides, thus acting as an etch mask. To be effective as etch mask, the top imaging layer needs to contain sufficient silicon, usually greater than 10 wt %

The advantages of bilayer imaging over the conventional single layer imaging include higher resolution capability, wider process latitude, patterning high aspect ration features, and minimization of substrate contamination and thin film interference effects. Moreover, the thick organic underlayer offers superior substrate etch resistance. The bilayer imaging is most suitable for high NA exposure tools, imaging over substrate topography and patterning high aspect ratio patterns.

Various silicon-containing polymers have been used as polymer resins in the top imaging layer resists (see R. D. Miller and G. M. Wallraff, *Advanced Materials for Optics and Electronics*, p. 95 (1994)). One of the most widely used silicon-containing polymers is polysilsesquioxane. Both positive-tone and negative-tone resists have been developed using an aqueous base soluble polysilsesquioxane: poly(p-hydroxybenzylsilsesquioxane). For positive-tone bilayer resists, poly(p-hydroxybenzylsilsesquioxane) was modified with a diazo photoactive compound or an acid sensitive t-butyloxycarbonyl (t-BOC) for I-line and chemically amplified DUV lithography, respectively [U.S. Pat. No. 5,385,804, U.S. Pat. No. 5,422,223]. Positive-tone resists have also been developed by using dissolution inhibitors [U.S. Pat. N. 4,745,169]. For negative-tone bilayer resists, an azide functional group was chemically attached to poly(p-hydroxybenzylsilsesquioxane). Exposure of the azide functionalized poly(p-hydroxybenzylsilsesquioxane) caused crosslinking in the exposed regions. Thus, negative-tone images resulted. However, these bilayer resists suffer from inadequate resolution, low sensitivity, and poor resist profile in some cases due to high optical density.

In view of the state of prior art resists, it is desirable to develop new bilayer resists with high resolution, high sensitivity, and good profile control for patterning semiconductor circuities. In particular, new negative-tone silicon-containing resists are desirable since negative-tone resists generally offer advantages of better isolated feature resolution, good thermal stability, small isolated and dense feature bias.

SUMMARY OF THE INVENTION

Accordingly, one object of the present invention is to provide a highly sensitive, high resolution negative-tone resist compositions with relatively high silicon content.

Another object of the present invention is to provide chemically amplified negative-tone silicon-containing resist compositions that can be used as top imaging layer resists in multilayer lithography for semiconductor manufacturing, and, in particular, in the patterning of semiconductor circuities.

These and other objects are achieved according to the present invention by an acid catalyzed, high contrast crosslinking of silicon-containing polymers bearing a phenolic moiety by using crosslinking agents that react with the hydroxyl group of the phenolic moiety in the silicon polymers (O-alkylation). These objectives are achieved also by using a bulky photo-generated acid to reduce acid diffusion for high resolution. More specifically, highly sensitive, high resolution chemically amplified negative-tone resists are obtained by acid catalyzed crosslinking of aqueous base soluble hydroxybenzylsilsesquioxane polymer via O-alkylation. These crosslinking agents include, but are not limited to, uril and melamine derivatives. The O-alkylation not only increases the molecular weight of the parent polymer but also converts the hydrophilic hydroxyl group in the parent polymer into a less hydrophilic phenolic ether group. Both lead to high contrast for the negative-tone resists.

Another aspect of the present invention is directed toward a silicon-containing negative-tone chemically amplified resist composition which comprises (a) an aqueous base soluble phenolic silicon-containing polymer or copolymer; (b) a crosslinking agent; (c) an acid generator; (d) a solvent for said polymer resin and crosslinking agent; and, optionally, (e) a photosensitizer that is capable of absorbing irradiation in the mid-UV, deep-UV (e.g. 248 nm, 193 nm and 157 nm), extreme-UV, X-ray, e-beam or ion-beam range. The chemically amplified resist composition of the present invention may further comprise (f) a base and/or (g) a surfactant. The crosslinking agent, acid generator, photosensitizer, base and surfactant can be either a single compound or a combination of two or more compounds of the same function.

A further aspect of the present invention involves using the silicon containing resist in a bilayer imaging scheme where a thin layer of the silicon-containing resist is applied and imaged on a thick, highly absorbing organic underlayer. The images thus formed are then transferred into the underlayer through anisotropic $O_2$ or $CO_2$ reactive ion etching.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

DESCRIPTION OF BEST AND VARIOUS MODES FOR CARRYING OUT INVENTION

The present invention relates to a high sensitivity, high resolution, aqueous base developable silicon-containing negative-tone resist composition. The resist compositions of the present invention are especially suitable for the top imaging layers for bilayer imaging. In one embodiment of the invention, the high sensitivity, high resolution chemically amplified negative-tone resists are obtained by acid catalyzed crosslinking aqueous base soluble hydroxybenzyl-silsesquioxane polymer and copolymers with crosslinking agents that react with the hydroxyl group (O-alkylation) of the silicon-containing polymers. Examples of suitable crosslinking agents include, but not limited to, uril and melamine derivatives.

In another embodiment of the present invention, the chemically amplified silicon-containing negative-tone resist composition comprises (a) an aqueous base soluble phenolic silicon-containing polymer or copolymer; (b) a crosslinking agent; (c) an acid generator; (d) a solvent for said polymer resin and the crosslinking agent; and, optionally, (e) a photosensitizer that is capable of absorbing irradiation in the mid-UV, deep-UV (e.g. 248 nm, 193 nm and 157 nm), extreme-UV, X-ray or e-beam range. The silicon-containing chemically amplified resist composition of the present invention may further comprise (f) a base and/or (g) a surfactant. The crosslinking agent, acid generator, photosensitizer, base and surfactant can be either a single compound or a combination of two or more compounds of the same function.

The silicon-containing polymers or copolymers have the structure and functionalities that satisfies these requirements: aqueous base solubility, high silicon contents (greater than 5 wt %, preferably greater than 10 wt %), good thermal properties (glass transition temperature greater than 80° C., preferably greater than 100° C.), have functionalities that act as crosslinking sites for acid catalyzed crosslinking, good optical transparency at the imaging wavelength (OD less than $5/\mu m$, and preferably less than $1/\mu m$), and film forming capability. One family of such silicon-containing polymers have a basic structure as expressed by the following general formula:

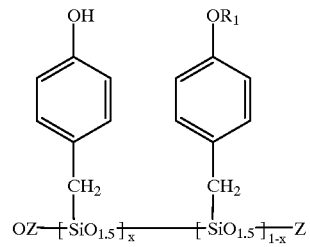

Where $R_1$ represents an acid insensitive (inert) blocking group. Examples of suitable $R_1$ groups include C1–C10 hydrocarbons, C2–C6 carbonates, and mesylate. The hydrocarbon groups include alkyl and aryl groups. These inert blocking groups serve to modulate the dissolution rate of the silicon-containing polymer resin. Z represents hydrogen or trimethylsilyl group. X represents molar fraction, being less than or equal to 1, preferably X=1–0.3 and more preferably X=1–0.6. The number average molecular weight of the silicon-containing polymer is about 800 to about 200,000, preferably about 1500 to about 20,000. The aqueous base soluble hydroxybenzylsilsesquioxane polymer and copolymers can be in ladder form, cage form, random form, and/or combinations of two or more of these forms.

The silicon-containing polymer may be prepared from alkoxybenzyltrihalidesilane by hydrolysis of the trihalidesilane into silanol and then followed by condensation of the silanol under the catalysis of bases. The resultant hydroxybenzylsilsesquioxane polymer and its copolymers with alkoxybenzylsilsequioxane can be obtained by controlled conversion or partial conversion of the alkoxyl group into hydroxyl group with boron tribromide. Other hydroxybenzylsilsesquioxane copolymers can be prepared by partial blocking of hydroxybenzylsilsesquioxane homopolymer with appropriate blocking groups, such as carbonate mesylate, and other ethers. For example, other ether blocked silicon-containing copolymers may be prepared by reacting the hydroxybenzylsilsesquioxane homopolymer with an alkylhalide. Ester blocked silicon-containing copolymers can be synthesized by reacting the hydroxybenzylsilsesquioxane homopolymer with carboxylic halide. Illustrative examples of the insert blocking groups include methoxy, ethoxy, isopropyl carbonate, acetoxy, and mesylate. The blocking level is typically less than 0.4 molar fraction of the phenolic group to ensure aqueous base solubility. Preferably, the blocking level is no more than 0.25 molar fraction of the phenolic group. It should be pointed out that more than two inert blocking groups can also be used to prepare the silicon-containing polymer resin as long as the said polymer resin is soluble in aqueous base and has adequate thermal property, i.e. glass transition temperature no less than 80° C. Therefore, aqueous base soluble hydroxybenzylsilsesquioxane terpolymers and higher polymers can also be used as the polymer resin for the negative-tone resist.

The crosslinking agents used in the present invention may be a single compound or a combination of two or more compounds that generate stable carbocations in the presence of photogenerated acid to crosslink the silicon-containing polymer resin at the hydroxyl site of the silicon polymer resin (O-alkylation). Such crosslinking reactions afford high contrast negative-tone resists because it not only leads to an increase in the molecular weight of the silicon polymer resin but also results in the conversation of the hydrophilic hydroxyl group into a less hydrophilic phenolic ether group. Typical crosslinking agents are uril and melamine derivatives with general formula as shown below.

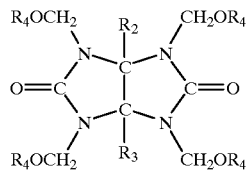

$R_2$, $R_3$=$C_1$–$C_8$ alkyl or $C_6$–$C_9$ aryl hydrocarbon
$R_4$=$CH_3$, $CH_2CH_3$; or

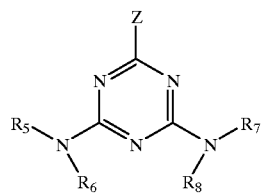

where

Z=NRR' or R" where R, R' and $R_5$–$R_8$ each independently represents H, $CH_2OH$, $CH_2ORa$. Where Ra is $C_1$–$C_4$ alkyl group.

These crosslinking agents are able to produce stable carbocations in the presence of photo-generated acid to effect high contrast crosslinking of the silicon-containing polymer resin containing phenolic moiety. The ability of these crosslinking agents to generate carbocations depends in large part on the size of the leaving groups. Generally, the smaller the leaving groups, the better it is to generate the carbocations. The carbocations thus generated crosslink the silicon-containing polymer at the hydroxyl site of the phenolic group, resulting in an increase in molecular weight of the silicon-containing polymer resin and a conversion of the polymer into a less hydrophilic structure. Therefore, high resist contrast ensues.

Suitable urils that can be used as the crosslinking agents include, but are not limited to, the following

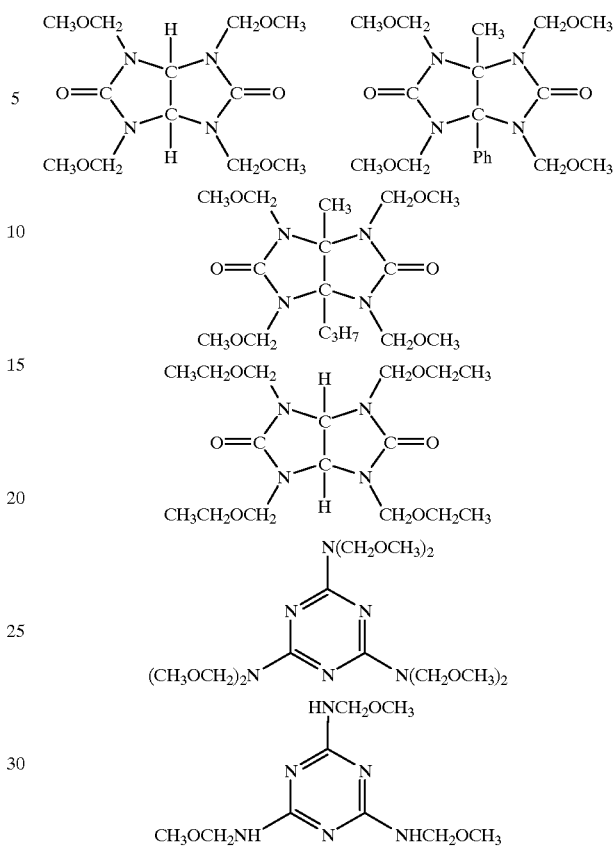

The preferred crosslinking agents are tetramethoxylmethyl glycouril (commonly available as Powderlink), methylpropyl Powderlink, and methylphenyl Powderlink. It should be pointed out that combinations of two or more of these crosslinking agents can also be used as crosslinking agents.

The photoacid generator used in the resist formulation (component c) of the present invention are compounds which generate an acid upon exposure to energy. They are commonly employed herein as well as in the prior art to generate stable carbocations of the crosslinking agents for the crosslinking of the silicon-containing polymer resins. Illustrative classes of such acid generators that can be employed in the present invention include, but are not limited to: nitrobenzyl compounds, onium salts, sulfonates, carboxylates and the like. To minimize acid diffusion for high resolution capability, the acid generators should be such that they generate bulky acids upon exposure to energy. These bulky acids contain at least 4 carbon atoms. A preferred acid generator employed in the present invention is an onium salt such as an iodonium salt or a sulfonium salt. Examples of photoacid generators are discussed in great length in disclosure of which is incorporated herein by reference. More preferred acid generators are di(t-butylphenyl) iodonium perfluorobutane sulfonate, di(t-butylphenyl) iodonium perfluorohexane sulfonate, di(t-butylphenyl) iodonium perfluoroethylcyclohexane sulfonate, and di(t-buylphenyl) iodonium camphoresulfonate.

The specific photoacid generator selected will depend on the irradiation being used for patterning the resist. Photoacid generators are currently available for a variety of different wavelengths of light from the visible range to the X-ray range; thus, imaging of the resist can be performed using deep-UV, extreme-UV, e-beam, laser or any other irradiation source deemed useful.

The solvents that are employed as component (d) of the resist formulation of the present invention are solvents well known to those skilled in the art. They are used to dissolve the silicon-containing polymer, the crosslinking agent, the photoacid generator and other components. Illustrative examples of such solvents include, but are not limited to: ethers, glycol ethers, aromatic hydrocarbons, ketones, esters and the like.

Suitable glycol ethers that can be employed in the present invention include: 2-methoxyethyl ether (diglyme), ethylene glycol monomethyl ether, propylene glycol monomethyl ether, propylene glycol monoether acetate (PGMEA) and the like. Examples of aromatic hydrocarbons that may be employed in the present invention include toluene, xylene and benzene; examples of ketones include methylisobutylketone, 2-heptanone, cycloheptanone, and cyclohexanone; an example of an ether is tetrahydrofuran; whereas ethyl lactate and ethoxy ethyl propionate are examples of esters that can be employed in the present invention. Of the solvents mentioned hereinabove it is preferred that a glycol ether or ester be employed, with PGMEA being the most preferred glycol ether and ethyl lactate is the most preferred ester.

The optional component of the present invention, i.e. the photosensitizer, is composed of compounds containing chromophores that are capable of absorbing radiation in the mid-UV, deep-UV, extreme-UV, X-ray or e-beam range. Illustrative examples of such compounds for mid-UV radiation include, but are not limited to: 9-anthracene methanol, coumarins, 9,10-bis(trimethoxysilyl ethynyl) anthracene and polymers containing these chromophores. Of these compounds, it is preferred to use 9-anthracene methanol as the photosensitive compound for irradiation source.

The bases that can be employed in the present invention, as component (f), include, but are not limited to: Coumarins, berberine, cetyltrimethylammonium hydroxide, 1,8-bis (dimethylamino)naphthalene, tetrabutyl ammonium hydroxide (TBAH), amines, polymeric amines and the like. Of these bases, it is preferred that coumarins be employed in the present invention as the base component.

The surfactants that can be employed in the present invention as those that are capable of improving the coating homogeneity of the chemically amplified negative-tone resist compositions of the present invention. Illustrative examples of such surfactants include: fluorine-containing surfactants such as 3M's FC-430 and siloxane-containing surfactants such as Union Carbide's SILWET series and the like.

The combination of these resist components should be such that the silicon content in the formulated resist compositions is at least about 3 wt %, preferably at least about 8 wt %, in order to achieve sufficient RIE etch selectivity to the organic underlayer materials.

In accordance with the present invention, the chemically amplified silicon-containing negative-tone resist composition preferably comprises from about 0.1 to about 50 wt. % of component (a); from about 0.005 to about 40 wt. % of component (b); from about 0.001 to about 14 wt. % of component (c); and from about 40 to about 99.5 wt. % of component (d). If a photosensitizer is present, it is preferably present in an amount of from about 0.001 to about 8 wt. %. When a base and/or surfactant are used, they are preferably present in an amount of from about 0.001 to about 16 wt. % of said base (component f), and from about 100 to about 1000 PPM wt. % of said surfactant (component g). More preferably, the chemically amplified silicon-containing negative-tone resist composition of the present invention comprises from about 0.5 to about 30 wt. % of component (a); from about 0.05 to about 20 wt. % of component (b); from about 0.005 to about 10 wt. % of component (c); from about 80 to about 98 wt. % of component (d); and, if present, from about 0.002 to about 8 wt. % of a photosensitizer, from about 50 to about 800 PPM wt % of a base, and from about 250 to about 1000 PPM wt. % of a surfactant.

In accordance with the present invention, the silicon-containing resist compositions can be used as a top imaging layer in a multilayer imaging scheme for manufacturing of semiconductor devices. As an illustrative example, the silicon-containing resist compositions used in a bilayer imaging is described as follows: In the bilayer imaging scheme, the resist system comprises of two layers: a silicon-containing top imaging layer as disclosed hereinabove and a highly absorbing organic underlayer. The underlayer material typically meets the following requirements to achieve optimum imaging results: matched reflective index with the top imaging layer, optimum absorption at the imaging wavelength to reduce thin film interference effects, optimum chemical and physical interaction between the top layer and the underlayer (good adhesion but no intermixing), chemical inertness to prevent contamination of the top layer. Illustrative examples of underlayer materials for 248 nm imaging include, but not limited to, hard baked Novolak resins, hard baked I-line resists, plasma deposited diamond-like carbon, crosslinked polymers with an appropriate die or thick DUV bottom anti-reflective coatings, such as IBM's BARL, Shipley's AR3, and Brewer Science's DUV 30. The thickness of the underlayer film is dictated by the substrate etching needs. It should be no less than 300 nm, preferably no less than 500 nm.

The bilayer imaging process is well known to those skilled in the art. This process comprises the following steps: The organic underlayer material is deposited, usually by spin coating, on the substrate. The underlayer material undergoes a baking or other processing steps, such as UV hardening to effect crosslinking in order to prevent inter-mixing between the top imaging layer and the underlayer. The silicon-containing top imaging layer is then applied on top of the underlayer film and baked to give a top layer thickness typically about 50 to 400 nm, preferably about 100 to 300 nm. The top imaging layer is exposed to an appropriate irradiation source. This is followed by post-exposure baking and development in an aqueous base developer, such as aqueous tetramethyl ammonium hydroxide (TMAH) solution. The images thus obtained in the top imaging layer are then transferred to the underlayer with an anisotropic RIE. The etch chemistry can be $O_2$, $CO_2$, $SO_2$ and/or a combination of these etch chemistries.

The following non-limiting examples are given to further illustrate the present invention. Because these examples are given for illustrative purposes only, the invention embodied therein should not be limited thereto.

EXAMPLE 1

20.0 g of 14.6 wt % poly(4-hydroxybenzylsilsesquioxane) (PHBS) solution in PGMEA was formulated with 0.423 g of Powderlink, 0.176 g of di(t-butylphenyl) iodonium camphoresulfonate (BPICS), 0.353 g of 1.0 wt % Coumarin-1 solution in PGMEA, 0.2 g of 10.0 wt % FC-430 solution in PGMEA, and 13.05 g of PGMEA. The resultant formulation was filtered through a 0.2 μm filter and spin coated on a 1 μm hard baked (230° C. for 8 min.) I-line resist on a silicon wafer to obtain an about 0.2 µm thick top imaging layer. The resist film was subsequent baked at 110° C. for 60 seconds and exposed to 248 nm DUV light on a Nikon (0.6NA) DUV stepper. After exposure the resist film was baked at 116° C. for 60 seconds followed by a 50 seconds immersion development with a 0.14N TMAH developer. 190 nm line and space features were resolved.

EXAMPLE 2

20.0 g of 15.0 wt % poly(4-hydroxybenzylsilsesquioxane) (PHBS) solution in PGMEA was formulated with 0.434 g of Powderlink, 0.181 g of di(t-butylphenyl) iodonium camphoresulfonate, 0.362 g of 1.0 wt % Coumarin-1 solution in PGMEA, 0.2 g of 10.0 wt % FC-430 solution in PGMEA, and 13.96 g of PGMEA. The resultant formulation was filtered through a 0.2 µm filter and spin coated on a 0.8 µm hard baked (230° for 2 min.) I-line resist on a silicon wafer to obtain an about 0.2 µm thick top imaging layer. The resist film was subsequent baked at 110° C. for 60 seconds and exposed to 248 nm DUV light on a Nikon (0.6NA) DUV stepper. After exposure, the resist film was baked at 116° C. for 60 seconds followed by a 20 seconds each double puddle development with a 0.14N TMAH developer. The top layer resist images were then transferred to the I-line underlayer with oxygen reactive ion etching using a LAM TCP 9400 plasma etch tool. Residue-free 190 nm line and space feature were obtained.

EXAMPLE 3

5.0 g of 15.0 wt % poly(4-hydroxybenzylsilsesquioxane) (PHBS) solution in PGMEA was formulated with 0.051 g of Powderlink, 0.056 g of di(t-butylphenyl) iodonium camphoresulfonate, 0.086 g of 1.0 wt % Coumarin-1 solution in PGMEA, 0.05 g of 10.0 wt % FC-430 solution in PGMEA, and 3.09 g of PGMEA. The resultant formulation was filtered through a 0.2 µm filter and spin coated on a 0.7 µm hard baked (230° C. for 4 min.) DUV ARC (IBM's BARL) on a silicon wafer to obtain an about 0.2 µm thick top imaging layer. The resist film was subsequent baked at 110° C. for 60 seconds and exposed to 248 nm DUV light on a GCA (0.53NA) DUV stepper. After exposure, the resist film was baked at 116° C. for 60 seconds followed by a 30 seconds each double puddle development with a 0.14N TMAH developer. 175 nm line and space features were resolved.

EXAMPLE 5

5.0 g of 15.0 wt % poly(4-hydroxybenzylsilsesquioxane) (PHBS) solution in PGMEA was formulated with 0.111 g of methypropyl Powderlink, 0.060 g of di(t-butylphenyl) iodonium camphoresulfonate, 0.092 g of 1.0 wt % Coumarin-1 solution in PGMEA, 0.05 g of 10.0 wt % FC-430 solution in PGMEA, and 3.63 g of PGMEA. The resultant formulation was filtered through a 0.2 µm filter and spin coated on a 0.7 µm hard baked (230° C. for 4 min.) DUV ARC (IBM's BARL) on a silicon wafer to obtain an about 0.2 µm thick top imaging layer. The resist film was subsequent baked at 110° C. for 60 seconds and exposed to 248 nm DUV light on a GCA (0.53NA) DUV stepper. After exposure, the resist film was baked at 116° C. for 60 seconds followed by a 30 seconds each double puddle development with a 0.14N TMAH developer. 225 nm line and space features were resolved.

EXAMPLE 7

5.0 g of 15.0 wt % poly(4-hydroxybenzylsilsesquioxane) (PHBS) solution in PGMEA was formulated with 0.179 g of methylpropyl Powderlink, 0.065 g of di(t-butylphenyl) iodonium perfluorooctane sulfonate, 0.099 g of 1.0 wt % Coumarin-1 solution in PGMEA, 0.05 g of 10.0 wt % FC-430 solution in PGMEA, and 4.26 g of PGMEA. The resultant formulation was filtered through a 0.2 µm filter and spin coated on a 0.7 µm hard baked (230° C. for 4 min.) DUV ARC (IBM's BARL) on a silicon wafer to obtain an about 0.2 µm thick top imaging layer. The resist film was subsequent baked at 110° C. for 60 seconds and exposed to 248 nm DUV light on a GCA (0.53NA) DUV stepper. After exposure, the resist film was baked at 116° C. for 60 seconds followed by a 30 seconds each double puddle development with a 0.14N TMAH developer. 175 nm line and space features were resolved.

EXAMPLE 8

20 g of 15.0 wt % poly(4-hydroxybenzylsilsesquioxane) (PHBS) solution in PGMEA was formulated with 0.991 g of methylphenyl Powderlink, 0.278 g of di(t-butylphenyl) iodonium perfluorooctane sulfonate, 0.427 g of 1.0 wt % Coumarin-1 solution in PGMEA, 0.20 g of 10.0 wt % FC-430 solution in PGMEA, and 19.59 g of PGMEA. The resultant formulation was filtered through a 0.2 µm filter and spin coated on a 0.7 µm hard baked (230° C. for 4 min.) DUV ARC (IBM's BARL) on a silicon wafer to obtain an about 0.2 µm thick top imaging layer. The resist film was subsequent baked at 110° C. for 60 seconds and exposed to 248 nm DUV light on an ASM (0.60NA) DUV stepper. After exposure, the resist film was baked at 116° C. for 60 seconds followed by a 30 seconds each double puddle development with a 0.14N TMAH developer. 175 nm features were resolved.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

Having thus described our invention, what we claim is new, and desire to secure by Letters Patent is:

1. A chemically amplified silicon-containing negative-tone resist composition comprising:
   (a) an aqueous base soluble silicon-containing polymer having phenolic group for O-alkylation
   (b) an acid catalyzable crosslinking agent capable of crosslinking the silicon-containing polymer at the hydroxyl site of the phenolic group
   (c) an acid generator; and
   (d) a solvent for the polymer and further comprising one or more of:
   (e) a photosensitizer that is capable of absorbing irradiation in the mid-UV, deep-UV, extreme-UV, X-ray, e-beam or ion-beam range;
   (f) a base; and (g) a surfactant.

2. The chemically amplified silicon-containing resist composition of claim 1 wherein the aqueous base soluble silicon-containing phenolic polymer has the following formula

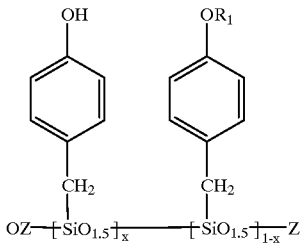

wherein $R_1$ represents an acid insensitive (inert) blocking group, Z represent H or —Si $(CH_3)_3$, X represents molar fraction, of less than or equal to 1, and wherein the number average molecular weight of the silicon-containing polymer is about 800 to about 200,000.

3. The chemically amplified silicon-containing resist composition of claim 1 wherein the aqueous base soluble silicon-containing phenolic polymer is selected from the group of poly(4-hydroxybenzylsilsesquioxane) and poly(4-hydroxybenzylsilsesquioxane-co-methoxybenzylsilsesquioxane).

4. The chemically amplified silicon-containing resist composition of claim 1 wherein the acid catalyzable crosslinking agent is at least one compound represented by the following formula

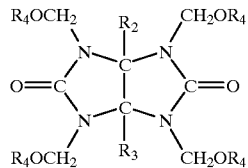

$R_2$, $R_3$=$C_1$–$C_8$ alkyl or $C_6$–$C_9$ aryl hydrocarbon
$R_4$=$CH_3$, $CH_2CH_3$

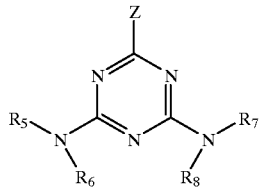

Z=NRR', R"

R, R', R", $R_5$–$R_8$ each independently represents H, —$CH_2OH$, —$CH_2ORa$, where Ra represents lower alkyl groups of $C_1$–$C_8$ carbon atoms.

5. The chemically amplified silicon-containing resist composition of claim 1 wherein the acid catalyzable crosslinking agent is selected from the group consisting of tetramethoxymethyl glycouril, methylpropyl tetramethoxymethyl glycouril and methylphenyl tetramethoxy methyl glycouril.

6. The chemically amplified silicon-containing resist composition of claim 1 wherein the acid generator is at least one compound selected from the group consisting of nitrobenzyl compounds, onium salts, sulfonates and carboxylates, and wherein the acid generator is capable of generating a bulky acid containing at least 4 carbon atoms.

7. The chemically amplified silicon-containing resist composition of claim 1 wherein the acid generator is at least one compound selected from the group consisting of di(t-butylphenyl) iodonium perfluorobutane sulfonate, di(t-butylphenyl) iodonium perfluorohexane sulfonate, di(t-butylphenyl) iodonium perfluorooctane sulfonate, di(t-butylphenyl) iodonium perfluorooctane sulfonate, di(t-butylphenyl) iodonium perfluoroethylcyclohexane sulfonate, and di(t-butylphenyl) iodonium camphoresulfonate.

8. The chemically amplified silicon-containing negative-tone resist composition of claim 1 wherein the chemically amplified silicon-containing negative-tone resist composition comprises from about 0.1 to about 50 wt. % of component (a); from about 0.005 to about 40 wt. % of component (b); from about 0.001 to about 14 wt. % of component (c); and from about 40 to about 99.5 wt. % of component (d); from about 0.001 to about 8 wt. % component (e); from about 0.001 to about 16 wt. % of component (f); and from about 100 to about 1000 PPM wt. % of component (g).

9. The chemically amplified silicon-containing negative-tone resist composition of claim 8, wherein the chemically amplified silicon-containing negative-tone resist comprises from about 0.5 to about 30 wt. % of component (a); from about 0.05 to about 20 wt. % of component (b); from about 0.005 to about 10 wt. % of component (c); from about 80 to about 98 wt. % of component (d); and, if present, from about 0.002 to about 2 wt. % of component (e), from about 50 to about 800 PPM wt. % of component (f), and from about 250 to about 1000 PPM wt. % of component (g).

10. The chemically amplified resist system of claim 1 wherein the solvent is at least one compound selected from the group consisting of ethers, glycol ethers, aromatic hydrocarbons, lactones and esters.

11. The chemically amplified resist system of claim 1 wherein the photosensitizer is at least one compound selected from the group consisting of anthracene methanol, coumarins and 9,10-bis(trimethoxysilyl ethynyl) anthracene.

12. The chemically amplified resist system of claim 1 wherein the base is at least one compound selected from the group consisting of coumarin, berberine, cetyltrimethylammonium hydroxide, 1,8-bis(dimethylamine)naphthalene, tetrabutyl ammonium hydroxide, amines and polymeric amines.

13. The chemically amplified resist system of claim 1 wherein the surfactant is a fluorine-containing surfactant or a siloxane-containing surfactant.

14. A multilayer imaging process for manufacturing semiconductor devices wherein comprises using the chemically amplified silicon-containing negative-tone resist composition of claim 8 as the top imaging layer on top of a highly absorbing organic underlayer, imagewise exposing the top imaging layer to irradiation; developing the top imagery layer to form the desired image and transferring the image to the underlayer by reactive ion etching.

15. A multilayer imaging process for manufacturing semiconductor devices of claim 14 being a bilayer imaging process.

16. A single imaging process for manufacturing semiconductor devices wherein comprises using amplified silicon-containing negative-tone resist composition of claim 9 as a conventional single layer resist.

17. A chemically amplified silicon-containing negative-tone resist composition comprising:

a) an aqueous base soluble silicon-containing phenolic polymer having phenolic group for O-alkylation and the following formula:

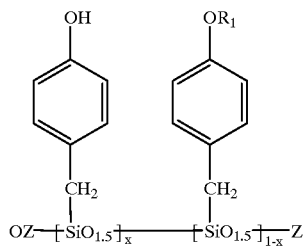

wherein $R_1$ represents an acid insensitive (inert) blocking group, Z represents H or $-Si(CH_3)_3$, X represents molar fraction of less than or equal to 1, and wherein the number average molecular weight of the silicon-containing polymer is about 800 to about 200,000;

b) an acid catalyzable crosslinking agent capable of crosslinking the silicon-containing polymer at the hydroxyl site of the phenolic group;

c) an acid generator; and d) a solvent for the polymer.

* * * * *

UNITED STATES PATENT AND TRADEMARK OFFICE
CERTIFICATE OF CORRECTION

PATENT NO. : 6,187,505 B1
DATED : February 13, 2001
INVENTOR(S) : Qinghuang Lin et al.

It is certified that error appears in the above-identified patent and that said Letters Patent is hereby corrected as shown below:

Claim 16,
Line 3, "claim 9" should read -- claim 8 --.

Signed and Sealed this

Sixth Day of November, 2001

Attest:

NICHOLAS P. GODICI
Attesting Officer   Acting Director of the United States Patent and Trademark Office